(12) United States Patent
Lin

(10) Patent No.: US 10,771,296 B1
(45) Date of Patent: Sep. 8, 2020

(54) 2.4GHZ ISM BAND ZERO-IF TRANSCEIVER AND METHOD THEREOF

(71) Applicant: Realtek Semiconductor Corp., Hsinchu (TW)

(72) Inventor: Chia-Liang (Leon) Lin, Fremont, CA (US)

(73) Assignee: REALTEK SEMICONDUCTOR CORP., Hsinchu (TW)

( * ) Notice: Subject to any disclaimer, the term of this patent is extended or adjusted under 35 U.S.C. 154(b) by 10 days.

(21) Appl. No.: 16/451,125

(22) Filed: Jun. 25, 2019

(51) Int. Cl.
*H04L 27/12* (2006.01)
*H04B 1/04* (2006.01)

(52) U.S. Cl.
CPC .............. *H04L 27/12* (2013.01); *H04B 1/04* (2013.01)

(58) Field of Classification Search
CPC ............ H04L 27/12; H03L 7/099; H04B 1/04
USPC ................................................ 375/302, 376
See application file for complete search history.

(56) References Cited

U.S. PATENT DOCUMENTS

| | | | | |
|---|---|---|---|---|
| 5,576,647 A * | 11/1996 | Sutardja | ............... | H03K 3/0231 327/108 |
| 6,600,355 B1 * | 7/2003 | Nguyen | .................... | G06F 1/08 327/149 |
| 2003/0184394 A1 * | 10/2003 | Lin | ....................... | H03K 3/0322 331/100 |
| 2005/0017887 A1 * | 1/2005 | Nagaso | ................. | H03L 7/1978 341/143 |
| 2015/0092622 A1 * | 4/2015 | Sturkovich | ............ | H04B 1/525 370/278 |
| 2016/0336944 A1 * | 11/2016 | Nakai | ..................... | H03L 7/095 |

* cited by examiner

*Primary Examiner* — Kevin M Burd
(74) *Attorney, Agent, or Firm* — McClure, Qualey & Rodack, LLP

(57) ABSTRACT

A method uses a controlled oscillator to output an oscillation signal in accordance with a control signal. The method operates by using a first divide-by-1.5 circuit to convert the oscillation signal into a first divided-down signal, using a second divide-by-1.5 circuit to convert the first divided-down signal into a second divided-down signal, using a divide-by-2 circuit to convert the second divided-down signal into a LO (local oscillator) signal, using a modulator to modulate the LO signal into a RF (radio frequency) signal in accordance with a baseband signal, and using a controller to establish the control signal in accordance with a relative timing between a reference signal and the oscillation signal.

20 Claims, 3 Drawing Sheets

2.4GHZ ISM BAND ZERO-IF TRANSCEIVER AND METHOD THEREOF

BACKGROUND OF THE DISCLOSURE

Field of the Disclosure

The present disclosure generally relates to radio transmitters, and more particularly to an IF radio transmitter circuit and method suitable for 2.4 GHz transmissions.

Description of Related Art

ISM (industrial, scientific, and medical) bands are radio bands reserved internationally for use in industrial, scientific, and medical purposes. Despite the original intent of the allocation, in recent years the fastest growing uses of these bands have been for short range communication systems. For instance, the 2.4 GHz ISM band (2.4 GHz~2.5 GHz) is widely used for WLAN (wireless local area network) applications.

In modern radio transmitters, zero-IF (intermediate frequency) architecture is widely used. In a zero-IF radio transmitter, a baseband signal directly modulates a local oscillator (LO) signal into a RF (radio frequency) signal that can be radiated to the air via an antenna. The LO signal is a periodic signal usually converted from a VCO (voltage-controlled oscillator) signal that is subject to an issue known as "VCO pulling". Here, components and issues like "zero-IF transmitter," "phase lock loop," "VCO," and "VCO pulling" are all known to those of ordinary skill in the art and thus not explained in detail. Since the LO signal is converted from the VCO signal, there is a harmonic relation between them. Generally, as the harmonic order increases, the severity of the VCO pulling is decreased. However, a high order of the harmonic relation usually requires a high-complexity conversion circuit.

What is desired is an improved circuit and method exhibiting less severe VCO pulling, while maintaining relative simplicity in design.

SUMMARY OF THE DISCLOSURE

In an embodiment, a transmitter includes a controlled oscillator, a first divide-by-1.5 circuit, a second divide-by-1.5 circuit, a divide-by-2 circuit, a modulator and a controller. The controlled oscillator outputs an oscillation signal in accordance with a control signal. The first divide-by-1.5 circuit converts the oscillation signal into a first divided-down signal. The second divide-by-1.5 circuit converts the first divided-down signal into a second divided-down signal. The divide-by-2 circuit converts the second divided-down signal into a LO (local oscillator) signal. The modulator modulates the LO signal into a RF (radio frequency) signal in accordance with a baseband signal. The controller establishes the control signal in accordance with a relative timing between a reference signal and the oscillation signal.

In an embodiment, a method includes the following steps: using a controlled oscillator to output an oscillation signal in accordance with a control signal; using a first divide-by-1.5 circuit to convert the oscillation signal into a first divided-down signal; using a second divide-by-1.5 circuit to convert the first divided-down signal into a second divided-down signal; using a divide-by-2 circuit to convert the second divided-down signal into a LO (local oscillator) signal; using a modulator to modulate the LO signal into a RF (radio frequency) signal in accordance with a baseband signal; and using a controller to establish the control signal in accordance with a relative timing between a reference signal and the oscillation signal.

DETAILED DESCRIPTION OF THIS DISCLOSURE

The present disclosure is directed to radio transmitters. While the specification describes several example embodiments of the disclosure considered favorable modes of practicing the invention, it should be understood that the invention can be implemented in many ways and is not limited to the particular examples described below or to the particular manner in which any features of such examples are implemented. In other instances, well-known details are not shown or described to avoid obscuring aspects of the disclosure.

Persons of ordinary skill in the art understand terms and basic concepts related to microelectronics that are used in this disclosure, such as "voltage," "current," "CMOS (complementary metal oxide semiconductor)," "PMOS (P-channel metal oxide semiconductor) transistor," "NMOS (N-channel metal oxide semiconductor) transistor," "resistor," "capacitor," "oscillator," "frequency," "phase," "in-phase," "quadrature", "signal," "current source," "operational amplifier," and "filter." Terms and basic concepts like these are apparent to those of ordinary skill in the art and thus will not be explained in detail here. Those of ordinary skill in the art will also recognize symbols of PMOS transistor and NMOS transistor, and identify the "source," the "gate," and the "drain" terminals thereof.

This present disclosure is disclosed in an engineering sense. For instance, "X is equal to Y" means "a difference between X and Y is smaller than a specified engineering tolerance"; "X is much smaller than Y" means "X divided by Y is smaller than an engineering tolerance"; and "X is zero" means "X is smaller than a specified engineering tolerance."

Figure 1:
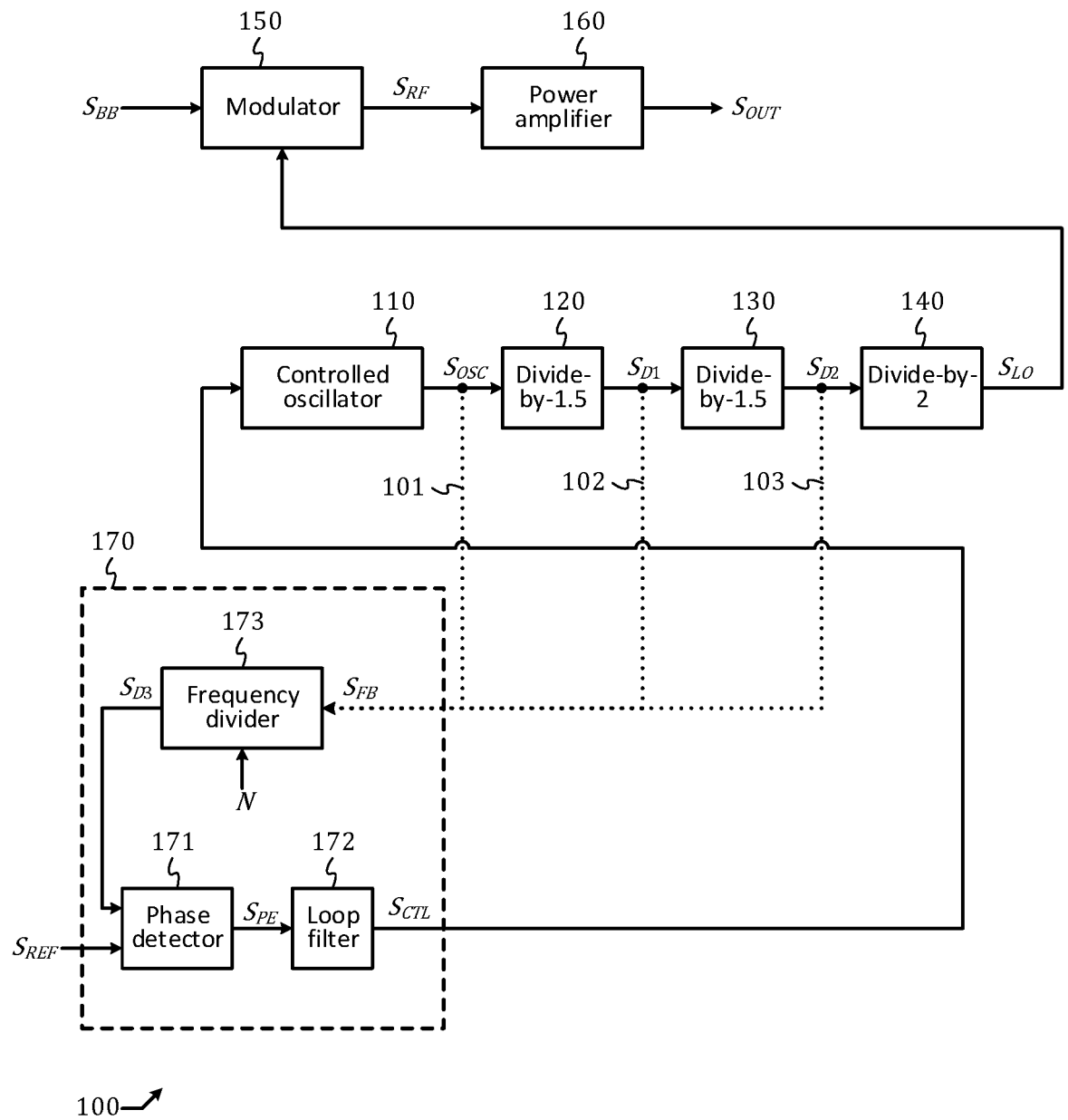
FIG. 1 shows a functional block diagram of a radio transmitter in accordance with embodiments of the present invention.

A functional block diagram of a radio transmitter 100 (hereafter transmitter 100 for brevity) in accordance with an embodiment of the present disclosure is depicted in FIG. 1. The radio transmitter 100 comprises: a controlled oscillator 110 configured to output an oscillation signal $S_{OSC}$ in accordance with a control signal $S_{CTL}$; a first divide-by-1.5 circuit 120 configured to convert the oscillation signal $S_{OSC}$ into a first divided-down signal $S_{D1}$; a second divide-by-1.5 circuit 130 configured to convert the first divided-down signal $S_{D1}$ into a second divided-down signal $S_{D2}$; a divide-by-2 circuit 140 configured to convert the second divided-down signal $S_{D2}$ into a local oscillator (hereafter LO for short) signal $S_{LO}$; and a modulator 150 configured to modulate the LO signal $S_{LO}$ into a radio frequency (hereafter RF for brevity) signal $S_{RF}$ in accordance with a baseband signal $S_{BB}$. Let a fundamental frequency of the oscillation signal $S_{OSC}$ be $f_{OSC}$, a fundamental frequency of the first divided-down signal $S_{D1}$ be $f_{D1}$, a fundamental frequency of the second divided-down signal $S_{D2}$ be $f_{D2}$, and a fundamental frequency of the LO signal $S_{LO}$ be $f_{LO}$. The first divided-by-1.5 circuit 120 performs a divide-by-1.5 function such that $$f_{D1}=f_{OSC}/1.5 \qquad (1)$$

The second divided-by-1.5 circuit 130 performs a divide-by-1.5 function such that $$f_{D2}=f_{D1}/1.5 \qquad (2)$$

The divide-by-2 circuit 140 performs a divide-by-2 functional such that $$f_{LO}=f_{D2}/2 \qquad (3)$$

Using equations (1), (2), and (3), we can obtain $$f_{LO}=f_{OSC}/4.5 \qquad (4)$$

That is, $$9f_{LO}=2f_{OSC} \qquad (5)$$

Equation 5 indicates that a ninth harmonic of the LO signal S_LO is equal to a second harmonic of the oscillation signal S_OSC. The harmonic relation between S_LO and S_OSC is therefore of a high order, thus effectively alleviating a pulling issue of the controlled oscillator 110.

The control signal $S_{CTL}$ is established by a controller 170 comprising: a frequency divider 173 configured to convert a feedback signal $S_{FB}$ into a third divided-down signal $S_{D3}$ in accordance with a divide-down factor N, wherein one cycle of the third dived-down signal $S_{D3}$ is generated in response to every N cycles of the feedback signal $S_{FB}$; a phase detector 171 configured to receive the third divided-down signal $S_{D3}$ and a reference clock signal $S_{REF}$ and output a phase error signal $S_{PE}$ representing a timing difference between the reference clock signal $S_{REF}$ and the third divided-down signal $S_{D3}$; and a loop filter 172 configured to filter the phase error signal $S_{PE}$ into the control signal $S_{CTL}$. In a first embodiment, the feedback signal $S_{FB}$ is the oscillation signal $S_{OSC}$, as indicated by a first dashed line 101; in a second embodiment, the feedback signal $S_{FB}$ is the first divided-down signal $S_{D1}$, as indicated by a second dashed line 102; in a third embodiment, the feedback signal $S_{FB}$ is the second divided-down signal $S_{D2}$, as indicated by a third dashed line 103.

In the first embodiment, the controller 170, along with the controlled oscillator 110, form a phase lock loop. In the second embodiment, the controller 170 along with the controlled oscillator 110 and the first divide-by-1.5 circuit 120 form a phase lock loop. In the third embodiment, the controller 170 along with the controlled oscillator 110, the first divide-by-1.5 circuit 120, and the second divide-by 1.5 circuit 130 form a phase lock loop. The first divide-by-1.5 circuit 120, the second divide-by-1.5 circuit 130, and the frequency divider 173) introduce a fixed timing delay to their respective output signals, but they maintain a relative timing relation. For instance, if $S_{OSC}$ advances by 1 ps in timing, so will $S_{D1}$, $S_{D2}$, and consequently $S_{FB}$ and $S_{D3}$, in any of these three embodiments. In other words, if a timing of $S_{OSC}$ is earlier than what it should be by 1 ps, so will a corresponding timing of $S_{D3}$. When a timing of the oscillation signal $S_{OSC}$ drifts by a positive (negative) amount relative to a timing of the reference signal $S_{REF}$, a timing of third divided-down signal $S_{D3}$ will also drift by the same positive (negative) amount relative to the timing of the reference signal $S_{REF}$; this prompts the phase detector 171 to output a smaller (greater) value of the phase error signal $S_{PE}$, resulting in a decrease (an increase) of a value of the control signal $S_{CTL}$; and this decreases (increases) the oscillation frequency of the oscillator 110, resulting in a negative (positive) amount of change of the timing of the oscillation signal $S_{OSC}$. In any of these three embodiments, therefore, a phase lock loop is formed, wherein the control signal $S_{CTL}$ is established in a negative feedback, closed-loop control manner to make the timing of the oscillation signal $S_{OSC}$ locked to the timing of the reference signal $S_{REF}$.

Circuit components like the phase detector, loop filter, frequency divider, and principles of phase lock loop are well known to those of ordinary skills in the art and thus not described in detail here. Consistent with the scope and spirit of the invention, the controller 170 can be implemented in many different schemes and not limited by what is explicitly shown in FIG. 1. In any case, the control signal 1 $S_{CTL}$ is adjusted in a closed loop manner in accordance with a relative timing relation between the reference signal $S_{REF}$ and the feedback signal $S_{FB}$, which is the oscillation signal $S_{OSC}$, or the first divided-down signal $S_{D1}$, or the second divided-down signal $S_{D2}$.

In an embodiment, the controller 170 is implemented in an analog scheme wherein the controlled oscillator 110 is a voltage-controlled oscillator (VCO), the phase detector 171 is an analog phase detector, the phase error signal $S_{PE}$ is an analog signal (either voltage or current), the loop filter 172 is an analog filter, and the control signal $S_{CTL}$ is an analog voltage. In another embodiment, the controller 170 is implemented in a digital scheme wherein the controlled oscillator 110 is a digitally controlled oscillator (DCO), the phase detector 171 is embodied by a TDC (time-to-digital converter), the phase error signal $S_{PE}$ is a digital code, the loop filter 172 is a digital filter, and the control signal $S_{CTL}$ is a digital code. VCO, DCO, are TDC are well known in the prior art and thus not explained in detail here. Persons of ordinary skill in the art understand a difference between "analog" and "digital" and thus concepts like this are not explained in detail here.

A divide-by-1.5 circuit, such as the first divide-by-1.5 circuit 120 and the second divide-by-1.5 circuit 130, receives an input signal and outputs an output signal, wherein two cycles of the output signal is generated in response to every three cycles of the input signal. That is, two cycles of $S_{D1}$ are generated in response to every three cycles of $S_{OSC}$, and two cycles of $S_{D2}$ are generated in response to every three cycles of $S_{D1}$. Divide-by-1.5 circuits are known in the prior art and thus not explained in detail here. For instance, Huang discloses a divide-by-1.5 clock generator in U.S. Pat. No. 5,552,732A.

A divide-by-2 circuit, such as the divide-by-2 circuit 140, receives an input signal and outputs an output signal, wherein one cycle of the output signal is generated in response to every two cycles of the input signal. That is, one cycle of $S_{LO}$ is generated in response to every two cycles of $S_{D2}$. Divide-by-2 circuits are known in the prior art and thus not explained in detail here. For instance, Lin discloses a divide-by-2 circuit in U.S. Pat. No. 10,209,735.

Modulator 150 performs a function of modulating $S_{LO}$ into $S_{RF}$ in accordance with $S_{BB}$ that can be mathematically described by the following equation:

$$S_{RF}=S_{BB}S_{LO} \qquad (6)$$

In many applications, the baseband signal $S_{BB}$ is a two-dimensional signal comprising an "in-phase" component, denoted as $S_{BB}^{I}$, and a "quadrature" component, denoted as $S_{BB}^{Q}$. In these applications, modulator 150 needs to be a "quadrature modulator" and the local oscillator signal $S_{LO}$ needs to be a two-dimensional signal comprising an "in-phase" component, denoted as $S_{LO}^I$, and a "quadrature" component, denoted as $S_{LO}^Q$, and equation (6) needs to be revised to $$S_{RF}=S_{BB}^I S_{LO}^I - S_{BB}^Q S_{LO}^Q \qquad (7)$$

Note that a divide-by-2 circuit, such as the divide-by-2 circuit 140, can readily output a two-dimensional $S_{LO}$, as shown in U.S. Pat. No. 10,209,735.

Both modulator of a function described by equation (6) and quadrature modulator of a function described by equation (7) can be embodied using a mixer circuit. Mixer circuits are known in the prior art and thus not described in detail here. For instance, U.S. Pat. No. 10,250,189 discloses a single-side band mixer that can be used to embody a quadrature modulator of a function described by equation (7).

In an embodiment, transmitter 100 further comprises a power amplifier 160 configured to receive the RF signal $S_{RF}$ and outputs an output signal $S_{OUT}$, which can be fed to an antenna (not shown in the figure). Components like the power amplifier and antenna are well known in the prior art and thus not explained in detail here.

Note that although a divide-by-1.5 circuit can functionally output two cycles of its output signal in response to every three cycles of its input signal, the output signal may not have 50% duty; besides, its output signal may not be uniform, unless its input signal has 50% duty. Also, although a divide-by-2 circuit can functionally output one "in-phase" cycle and one "quadrature" cycle of its output signal in response to every two cycles of its input signal, the "in-phase" cycle and the "quadrature" cycle may not have an accurate quadrature relation unless its input signal has 50% duty. In transmitter 100, therefore, it is highly desirable that $S_{OSC}$, $S_{D1}$, and $S_{D2}$ all have 50% duty. A duty cycle correction circuit may be incorporated at the discretion of circuit designers to ensure that $S_{OSC}$, $S_{D1}$, or $S_{D2}$ have 50% duty. Inserting a duty cycle correction circuit between the controlled oscillator 110 and the first divide-by-1.5 circuit 120 can ensure that $S_{OSC}$ has 50% duty and thus $S_{D1}$ can be uniform. Inserting a duty cycle correction circuit between the first divide-by-1.5 circuit 120 and the second divide-by-1.5 circuit 130 can ensure that $S_{D1}$ has 50% duty and thus $S_{D2}$ can be uniform. Inserting a duty cycle correction circuit between the second divide-by-1.5 circuit 130 and the divide-by-2 circuit 140 can ensure that $S_{D2}$ has 50% duty and thus $S_{LO}$ can have an accurate quadrature relation between its in-phase and quadrature components.

Figure 2:
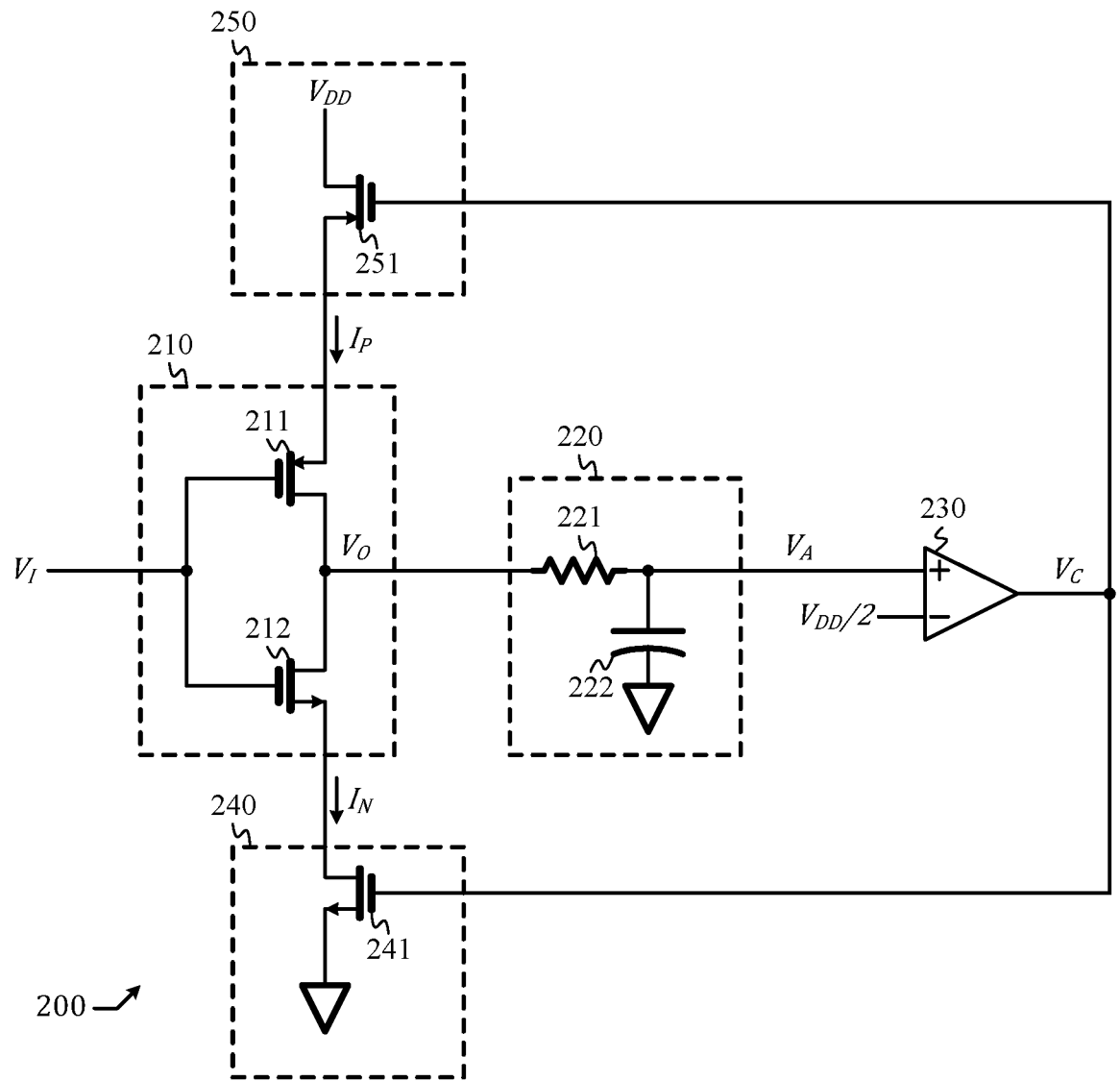
FIG. 2 shows a schematic diagram of a duty cycle correction circuit.

An embodiment of a duty cycle correction circuit 200 is shown in FIG. 2. Duty cycle correction circuit 200 receives an input signal $V_I$ and outputs an output signal $V_O$ and comprises: an inverter 210 configured to receive $V_I$ and output $V_O$ in accordance with an upper side (i.e. power side) current $I_P$ and a lower side (i.e. ground side) current $I_N$, wherein $I_P$ is determined by an upper side current source 250 controlled by a control voltage $V_C$ and $I_N$ is determined by a lower side current source 240 controlled by the control voltage $V_C$; a low-pass filter 220 configured to receive $V_O$ and outputs an average voltage $V_A$, and an operational amplifier 230 configured to output the control voltage $V_C$ in accordance with a difference between the average voltage $V_A$ and a half of a power supply voltage, i.e. $V_{DD}/2$. Here, "$V_{DD}$" denotes a power supply voltage. The inverter 210 comprises NMOS transistor 212 and PMOS transistor 211. The upper side current source 250 comprises PMOS transistor 251. The lower side current source 240 comprises NMOS transistor 241. The low-pass filter 220 comprises resistor 221 and capacitor 222. When a duty cycle of $V_O$ is greater (less) than 50%, the average voltage $V_A$ will be higher (lower) than $V_{DD}/2$, the operational amplifier 230 will raise (lower) $V_C$, thus causing NMOS transistor 241 to increase (decrease) $I_N$ and PMOS transistor 251 to decrease (increase) $I_P$, and consequently effectively decreasing (increasing) the duty of $V_O$. The duty of $V_O$ is thus adjusted toward 50% in a closed loop manner. The inter-connections of devices in FIG. 2 (for instance, the source of NMOS transistor 212 connects to the drain of NMOS transistor 241 and the drain of NMOS transistor 212 connects to the drain of PMOS transistor 211) are understood by those of ordinary skill in the art and thus not described in detail here. Likewise, operational amplifiers are well known in the prior art and thus not described in detail here. Note that a duty cycle correction circuit such as the duty cycle correction circuit 200 can be included as a part of a divide-by-1.5 circuit to ensure an output of the divider has 50% duty. For instance, a duty cycle correction circuit can be included as part of the first divide-by-1.5 circuit 120 on its output side to ensure that $S_{D1}$ has 50% duty. Likewise, a duty cycle correction circuit can also be included as part of the controlled oscillator 110 on its output side to ensure that $S_{OSC}$ has 50% duty.

Transmitter 100 is suitable for 2.4 GHz ISM applications, wherein: $f_{OSC}$ is between 10.8 GHz and 11.25 GHz; $f_{D1}$ is between 7.2 GHz and 7.5 GHz; $f_{D2}$ is between 4.8 GHz and 5 GHz; and $f_{LO}$ is between 2.4 GHz and 2.5 GHz. To allow $f_{OSC}$ to be an arbitrary frequency between 10.8 GHz and 11.25 GHz, the divide-down factor N needs to be a fractional number, and the phase lock loop mentioned earlier must be a "fractional-N phase lock loop." The concept of "fractional-N phase lock loop" is well known to those of ordinary skills in the art and thus not described in detail herein. In an embodiment, $f_{REF}$ is 40 MHz, the feedback signal $f_{FB}$ is the oscillation signal $f_{OSC}$, and the divide-down factor N is between 270 and 281.25. Transmitter 100 is suitable for 2.4 GHz ISM applications, since all the frequencies of operations are amenable to favorable circuit embodiments using a contemporary CMOS (complementary metal oxide semiconductor) manufacturing process. However, it should be understood that this present disclosure is not limited to 2.4 GHz ISM applications.

Figure 3:
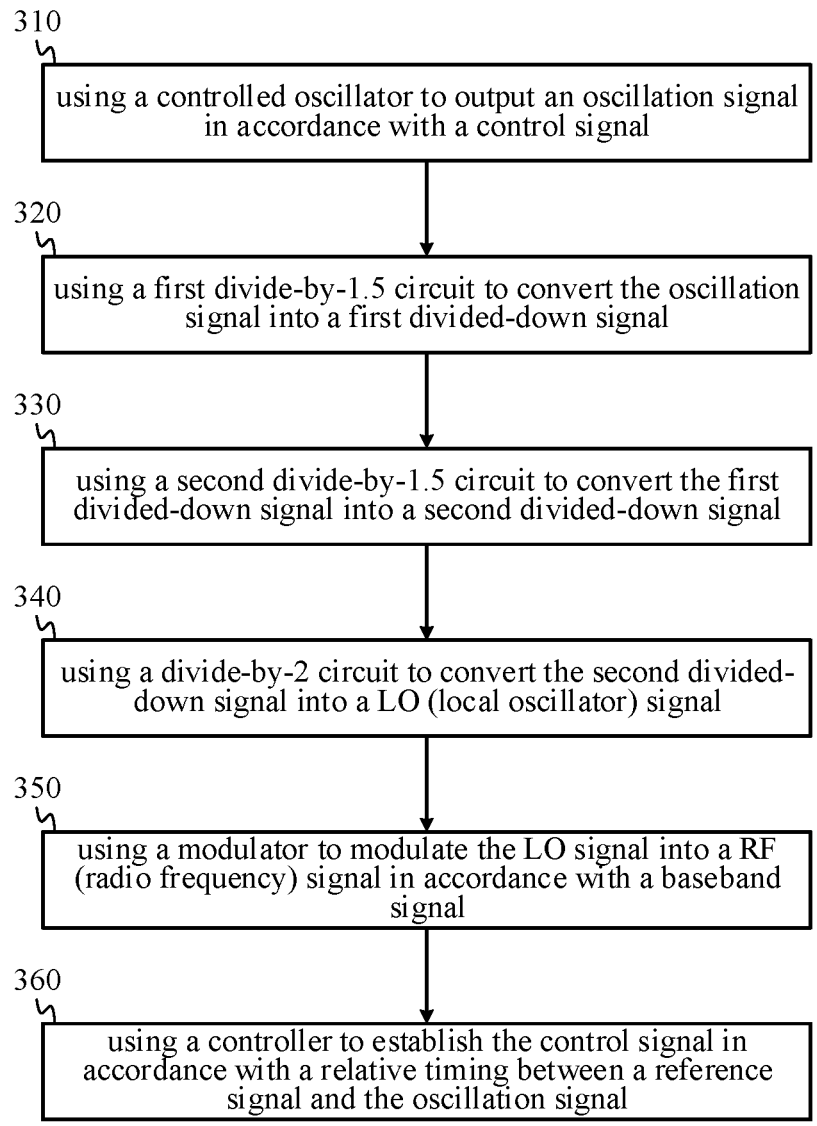
FIG. 3 shows a flow diagram of a method in accordance with embodiments of the present invention.

In an embodiment illustrated by a flow diagram shown in FIG. 3, a method comprises: (step 310) using a controlled oscillator to output an oscillation signal in accordance with a control signal; (step 320) using a first divide-by-1.5 circuit to convert the oscillation signal into a first divided-down signal; (step 330) using a second divide-by-1.5 circuit to convert the first divided-down signal into a second divided-down signal; (step 340) using a divide-by-2 circuit to convert the second divided-down signal into a LO (local oscillator) signal; (step 350) using a modulator to modulate the LO signal into a RF (radio frequency) signal in accordance with a baseband signal; and (step 360) using a controller to establish the control signal in accordance with a relative timing between a reference signal and the oscillation signal.

Those skilled in the art will readily observe that numerous modifications and alterations of the device and method may be made while retaining the teachings of the disclosure.

What is claimed is:
1. A transmitter comprising:
   a controlled oscillator configured to output an oscillation signal in accordance with a control signal;
   a first divide-by-1.5 circuit configured to convert the oscillation signal into a first divided-down signal;

a second divide-by-1.5 circuit configured to convert the first divided-down signal into a second divided-down signal;

a divide-by-2 circuit configured to convert the second divided-down signal into a LO (local oscillator) signal;

a modulator configured to modulate the LO signal into a RF (radio frequency) signal in accordance with a baseband signal; and a controller configured to establish the control signal in accordance with a relative timing between a reference signal and the oscillation signal, wherein the controller comprises:

a frequency divider configured to convert a feedback signal, which is selected from one of the oscillation signal, the first divided-down signal, and the second divided-down signal, into a third divided-down signal in accordance with a divide-down factor;

a phase detector configured to output a phase error signal representing a difference between a timing of the reference signal and a timing of the third divided-down signal; and a loop filter configured to filter the phase error signal into the control signal.

2. The transmitter of claim 1, wherein the phase detector is configured to receive the reference signal and the third divided-down signal.

3. The transmitter of claim 1, wherein the controlled oscillator is a voltage-controlled oscillator and the control signal is an analog voltage.

4. The transmitter of claim 1, wherein the controlled oscillator is a digitally controlled oscillator and the control signal is a digital code.

5. The transmitter of claim 1, wherein the controlled oscillator includes a duty cycle correction circuit.

6. The transmitter of claim 1, wherein the first divide-by-1.5 circuit includes a duty cycle correction circuit.

7. The transmitter of claim 1, wherein the second divide-by-1.5 circuit includes a duty cycle correction circuit.

8. The transmitter of claim 1, wherein the modulator comprises a mixer.

9. The transmitter of claim 8, wherein the baseband signal is a two-dimensional signal comprising an in-phase component and a quadrature component.

10. The transmitter of claim 9, wherein the LO signal is a two-dimensional signal comprising an in-phase component and a quadrature component.

11. A method comprising:

using a controlled oscillator to output an oscillation signal in accordance with a control signal;

using a first divide-by-1.5 circuit to convert the oscillation signal into a first divided-down signal; using a second divide-by-1.5 circuit to convert the first divided-down signal into a second divided-down signal;

using a divide-by-2 circuit to convert the second divided-down signal into a LO (local oscillator) signal;

using a modulator to modulate the LO signal into a RF (radio frequency) signal in accordance with a baseband signal; and using a controller to establish the control signal in accordance with a relative timing between a reference signal and the oscillation signal, wherein the controller comprises:

a frequency divider configured to convert a feedback signal, which is selected from one of the oscillation signal, the first divided-down signal, and the second divided-down signal, into a third divided-down signal in accordance with a divide-down factor;

a phase detector configured to output a phase error signal representing a difference between a timing of the reference signal and a timing of the third divided-down signal; and a loop filter configured to filter the phase error signal into the control signal.

12. The method of claim 11, wherein the phase detector is configured to receive the reference signal and the third divided-down signal.

13. The method of claim 11, wherein the controlled oscillator is a voltage-controlled oscillator and the control signal is an analog voltage.

14. The method of claim 11, wherein the controlled oscillator is a digitally controlled oscillator and the control signal is a digital code.

15. The method of claim 11, wherein the controlled oscillator includes a duty cycle correction circuit.

16. The method of claim 11, wherein the first divide-by-1.5 circuit includes a duty cycle correction circuit.

17. The method of claim 11, wherein the second divide-by-1.5 circuit includes a duty cycle correction circuit.

18. The method of claim 11, wherein the modulator comprises a mixer.

19. The method of claim 18, wherein the baseband signal is a two-dimensional signal comprising an in-phase component and a quadrature component.

20. The method of claim 19, wherein the LO signal is a two-dimensional signal comprising an in-phase component and a quadrature component.

* * * * *